United States Patent [19]

Flohrs et al.

[11] Patent Number: 4,916,494
[45] Date of Patent: Apr. 10, 1990

[54] MONOLITHIC INTEGRATED PLANAR SEMICONDUCTOR SYSTEM AND PROCESS FOR MAKING THE SAME

[75] Inventors: Peter Flohrs; Hartmut Michel, both of Reutlingen, Fed. Rep. of Germany

[73] Assignee: Robert Bosch GmbH, Stuttgart, Fed. Rep. of Germany

[21] Appl. No.: 107,855

[22] Filed: Oct. 6, 1987

Related U.S. Application Data

[63] Continuation of Ser. No. 783,221, Sep. 17, 1985, abandoned.

[51] Int. Cl.⁴ .......................................... H01L 29/90
[52] U.S. Cl. ...................................... 357/13; 357/28; 357/46; 357/14; 357/34; 357/51
[58] Field of Search .................. 357/13.2, 28, 51, 34, 357/14, 40

[56] References Cited

U.S. PATENT DOCUMENTS 4,258,311 3/1981 Tokuda et al. ...................... 357/28
4,618,875 10/1986 Flohrs ................................. 357/51

Primary Examiner—Edward J. Wojciechowicz
Attorney, Agent, or Firm—Michael J. Striker

[57] ABSTRACT

A monolithic integrated semiconductor device is described, wherein for the adjustment of the breakdown voltage a cover electrode (7) is disposed in the area of the pn-junctions and a corresponding potential is applied through a voltage divider (1) for adjusting the breakdown voltage. For maintaining a temperature independent breakdown voltage it is provided that the voltage divider (1) consists of resistors (R1, R2) in the form of diffused zones which have different doping levels. The resulting different temperature coefficients of the resistors (R1,R2) of the voltage divider cause a temperature dependent potential change of the cover electrode potential, whereby a temperature stabilization of the breakdown voltage is obtained.

8 Claims, 2 Drawing Sheets

MONOLITHIC INTEGRATED PLANAR SEMICONDUCTOR SYSTEM AND PROCESS FOR MAKING THE SAME

This is a continuation, of application Ser. No. 783,221, filed Sept. 17, 1985, now abandoned.

BACKGROUND OF THE INVENTION

The present invention is based on a monolithic integrated planar semiconductor device. From DE-OS No. 32 27 536 a semiconductor device is known designed as a Darlington transistor circuit, wherein the two transistors are monolithically integrated in a planar technique in a common substrate. Thereby, the substrate forms the collector zones of the two transistors. A passivation layer consisting of silicon dioxide is provided on the main surface of the substrate covering this main surface with the exception of contact windows. The base collector junctions of the two transistors are protected by a metal electrode which is present above the passivation layer and which may be characterized as a cover electrode. Moreover, this semiconductor is provided with an integrated voltage divider, whose top is connected with the cover electrode. The electrostatical field which emits from the cover electrode influences the breakdown voltage on the beneath disposed PN-junctions. By means of a suitable selection of the voltage divider an adjustment of the breakdown voltage may be performed, which, however, is very severely dependent from the temperature in the known semiconductor device.

SUMMARY OF THE INVENTION

It is an object of the present invention to provide a semiconductor device in which by the different doping of the two divider resistors a temperature dependent cover electrode potential is obtained. The doping of the two divider resistors is performed in such a manner that the resulting different temperature coefficients cause a temperature dependent potential change which acts against the temperature dependent change of the breakdown voltage.

Depending on the given structure of the semiconductor device and in view of the given requirements a different doping can be done in such a manner that a substantial temperature stabilisation of the breakdown voltage is obtained. Short circuiting Zener diodes may be installed to enable a subsequent balancing of the voltage divider.

According to a process for making the semiconductor device in accordance with the invention, both resistors are at first formed by a weakly doped semiconductor material, one of the resistors is then covered with a layer of lacquer, and subsequently the other resistor is provided with a higher doping by ion implantation. An oxide layer may be also used instead of the layer of lacquer which is used for masking or for covering the one resistor. However, tests have shown that the resistor to be covered may be covered with a layer of lacquer in a particularly advantageous manner.

Figure 1:
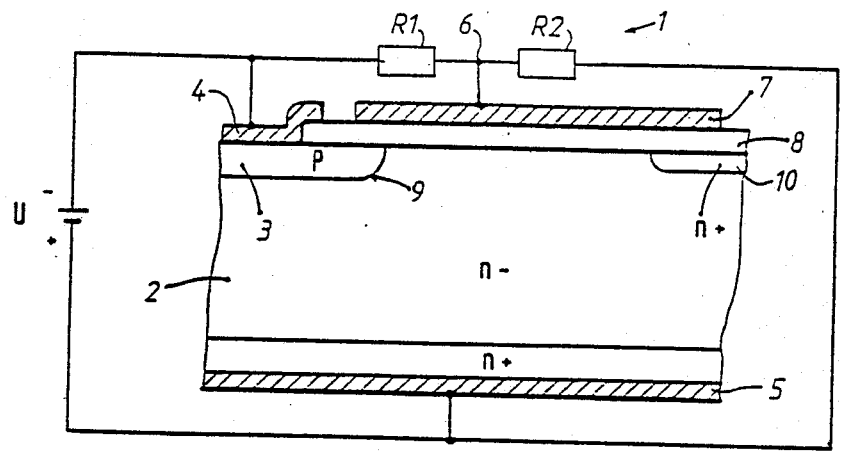
FIG. 1 is a partial section of a PN-junction with a voltage divider for adjusting the breakdown voltage on the PN-junction.
Figure 3:
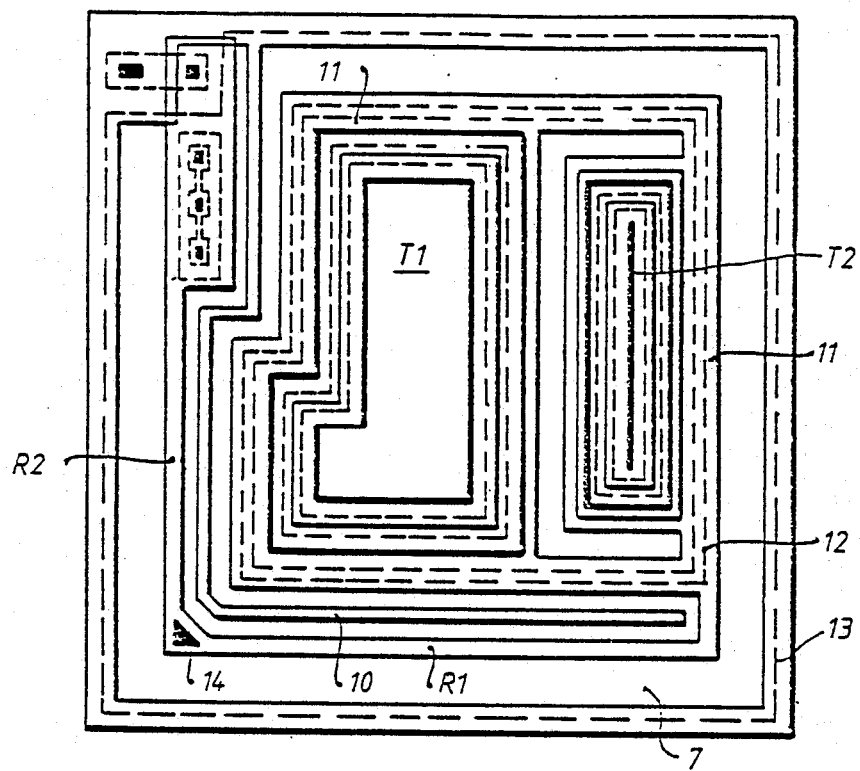
FIG. 3 is a plan view of a semiconductor device with integrated voltage divider designed as a Darlington-transistor circuit in accordance with the invention.

The section in the area of a PN-junction illustrated in FIG. 1 is connected with a voltage divider 1 which in this case is shown as an external voltage divider for clarity sake. This voltage divider 1 includes two resistors R1, and R2 formed by two resistance strips, as illustrated in FIG. 3.

The illustrated semiconductor device substantially consists of an $n^-$-conductive substrate 2 into which a p-conductive zone 3 is diffused. A metal electrode 4 is disposed above the p-zone 3 and is connected with the minus pole of a voltage source U and the first divider resistor R1 of the voltage divider 1. The second resistor R2 of the voltage divider 1 and the plus pole of the voltage source U are connected with a metallisation 5 applied to the underside of substrate 2. The divider voltage which is generated on the tap 6 of the voltage divider 1 is applied to a cover electrode 7 which is mounted to an oxide layer 8 in such a manner that it overlaps the PN-junction 9 and the space charge regions in the arresting areas. While the space charge does not reach far into p-conductive area 3 because of the higher doping with respect to the $n^-$-conductive area (substrate 2), it is limited by an arresting $n^+$ zone 10 which is diffused in. By means of the cover electrode 7 which is mounted above the oxide layer 8 serving as an insulator, the PN-junction is so protected that the arresting behavior cannot be influenced in any undesirable manner by outer influences (for example, materials with polar groups, alkali ions, metal tinsel etc.)

The illustrated section illustrates a PN-junction 9 which may be a part of a diode or a transistor circuit The cover electrode 7 which is designed as a metal electrode overlaps the $n^+$ zone 10 which is simultaneously diffused in with the emitter or emitters of a transistor circuit. The obtainable breakdown voltage $U_{Br}$ on the illustrated PN-junction 9 substantially depends, in addition to the the base doping of the silicon (substrate 2), also from the thickness of the oxide layer 8 which consists of silicon dioxide and the potential of the cover electrode 7.

Figure 2:
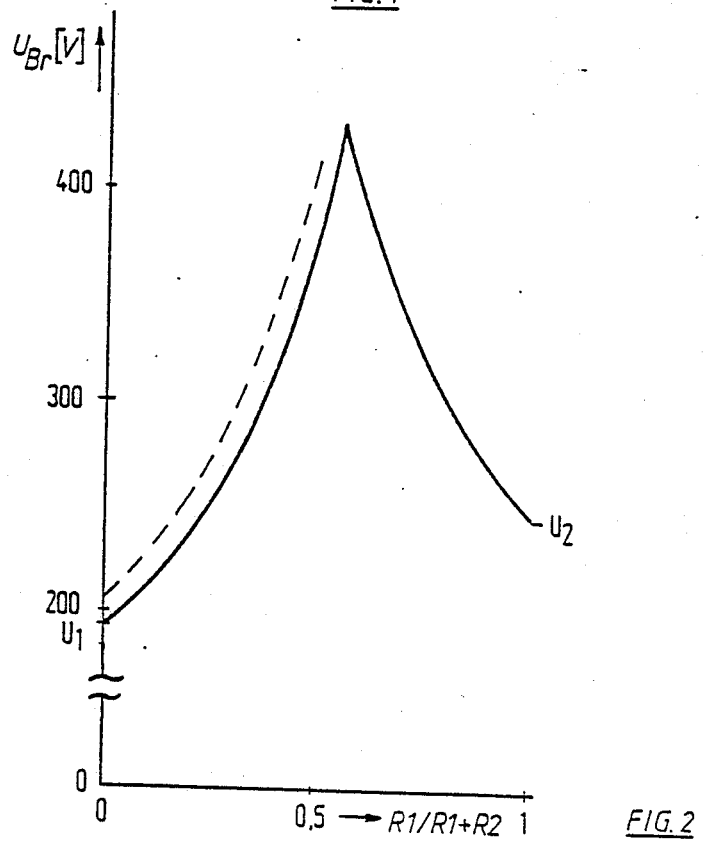
FIG. 2 is a graph showing the breakdown voltage on the PN-junction in dependency from the divider ratio of the voltage divider.

FIG. 2 illustrates the dependency of the breakdown voltage $U_{Br}$ from the divider ratio R1/R1+R2 of the voltage divider. Thereby, U1 is the breakdown voltage at the PN-junction 9, which is obtained if the cover electrode 7 is connected directly to p-zone 3 without the resistor R1. In the subject example it is noticeably smaller than the breakdown voltage which is obtainable without the cover electrode 7. The breakdown voltage U2 is obtained if the resistor R2 is short circuited.

The interrupted line illustrates the ascending branch of the breakdown voltage as a result of a higher temperature. When the two resistors R1 and R2 are created with different temperature coefficients, the temperature dependency of the breakdown voltage may be neutralized thereby. Due to the different high doping the temperature coefficient of the first resistor R1 is, for example, $6 \cdot 10^{-3}/K$ and the one of the second resistor R2 $8 \cdot 10^{-3}/K$. For the left branch of the curve illustrated in FIG. 2 the following is true:

$$U_{Br} = U1(R1/R2 + 1)$$

wherein
U1 is (25° C.)=200 V; R1/R2 (25° C.)=1 and
U1 (125° C.)=212 V,
thereby $U_{Br}$ is (25° C.)=400 V
at a temperature of 125° C. it is
R2 (125° C.)=1,8 . R2 (25° C.)
R1 (125° C.)=1,6 . R1 (25° C.)
thereby $U_{Br}$ is (125° C.) 400 V.

A desired temperature stabilisation of the breakdown voltage can be obtained by a suitable doping.

The exemplified embodiment illustrated in FIG. 3 shows how the voltage divider can be monolithically integrated. The voltage divider 1 consists of two diffused longitudinal p-conductive zones which form the resistors R1 and R2. Adjacent to the voltage divider 1 is an arresting strip 10 which is n+-doped. This arresting zone 10 is disposed between the voltage diver 1 and a p-zone 11 which forms the base area between two transistors T1 and T2. The arresting strip 10 acts against an electrical connection which could be generated when applying the arresting voltage through the space charge between the divider 1 and the PN-junction 9.

The limitation of the cover electrode 7 is drawn by interrupted lines 12 and 13. A contact window 14 which forms the tap 6 of the voltage divider 1 is electrically connected with the cover electrode 7.

The two resistors R1 and R2 may at first be formed from a weak doped semiconductor material, whereby the resistor R1 may be provided with a higher doping by means of an ion implantation. The resistor R2 may be covered with a layer of lacquer before using the ion implantation.

Due to the different high doping one obtains different temperature coefficients for the two resistors R1, R2, which, for example, may have the values mentioned above in conjunction with FIG. 2.

The further structure of the semiconductor illustrated in FIG. 3 is known per se and is directed in detail in the mentioned DE-OS No. 32 27 536.

We claim:

1. A monolithic integrated planar semiconductor device comprising at least one PN-junction including a substrate having a defined type of conductivity and a zone of a type of conductivity which is contrary to that of said substrate and is diffused into said substrate, said substrate having a passivation layer being situated on the surface from which said zone of said type of contrary conductivity is diffused into the substrate and covering space charge zones generated in said substrate when said PN-junction is biased in blocking direction, said PN-junction having a temperature-dependent breakdown voltage ($U_{Br}$), a cover electrode which is mounted over said passivation layer; a voltage divider including a first integrated resistor and a second integrated resistor, said voltage divider being connected in parallel to said PN-junction and a tap of which being connected with said cover electrode to bias the same with a divider voltage for adjusting said breakdown voltage; said first and second integrated resistors (R1, R2) having different temperature coefficients adjusted with respect to the temperature dependency of said breakdown voltage such that the resulting temperature-dependent divider voltage applied to said cover electrode (7) neutralizes said temperature dependency and makes the breakdown voltage ($U_{Br}$) of the PN-junction (9) substantially independent of temperature.

2. Semiconductor device in accordance with claim 1, including additional adjusting elements which are integrated with the voltage divider for adjusting the breakdown voltage $U_{Br}$.

3. Semiconductor device in accordance with claim 2, wherein said adjusting elements are Zener diodes.

4. Semiconductor device in accordance with claim 2, wherein said adjusting elements are short circuit bridges.

5. A monolithic integrated planar semiconductor device comprising at least one PN-junction including a substrate having a defined type of conductivity and a zone of a type of conductivity which is contrary to that of said substrate and is diffused into said substrate, said substrate having a passivation layer being situated on the surface from which said zone of said type contrary conductivity is diffused into the substrate and covering space charge zones generated in said substrate when said PN-junction is biased in blocking direction, said PN-junction having a temperature-dependent breakdown voltage ($U_{Br}$); a cover electrode which is mounted over said passivation layer; a voltage divider including a first integrated resistor and a second integrated resistor, said voltage divider being connected in parallel to said PN-junction and a tap of which being connected with said cover electrode to bias the same with a divider voltage for adjusting said breakdown voltage; said first and second integrated resistors (R1, R2) having different temperature coefficients adjusted with respect to the temperature dependency of said breakdown voltage such that the resulting temperature-dependent divider voltage applied to said cover electrode (7) neutralizes said temperature dependency and makes the breakdown voltage ($U_{Br}$) of the PN-junction (9) substantially independent of temperature, and wherein said first integrated resistor has a higher doping for producing a higher temperature coefficient and is formed by diffusion and ion implantation whereas said second integrated resistor has a lower doping for producing a lower temperature coefficient and is formed by diffusion only.

6. Semiconductor device in accordance with claim 5, including additional adjusting elements which are integrated with the voltage divider for adjusting the breakdown voltage $U_{Br}$.

7. Semiconductor device in accordance with claim 6, wherein said adjusting elements are Zener diodes.

8. Semiconductor device in accordance with claim 6, wherein said adjusting elements are short circuit bridges.

* * * * *